United States Patent
Xia et al.

(10) Patent No.: US 11,803,263 B2
(45) Date of Patent: Oct. 31, 2023

(54) DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Wei Xia, Beijing (CN); Tao Gao, Beijing (CN); Yuanzheng Guo, Beijing (CN); Yongzhan Han, Beijing (CN); Peng Hou, Beijing (CN); Yanqiang Wang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 98 days.

(21) Appl. No.: 17/211,957

(22) Filed: Mar. 25, 2021

(65) Prior Publication Data
US 2022/0075469 A1 Mar. 10, 2022

(30) Foreign Application Priority Data

Sep. 7, 2020 (CN) .......................... 202010930687.4

(51) Int. Cl.
| | | |
|---|---|---|
| G06F 3/041 | (2006.01) | |
| G06F 3/044 | (2006.01) | |
| H10K 50/844 | (2023.01) | |
| H10K 59/122 | (2023.01) | |
| H10K 59/38 | (2023.01) | |
| H10K 59/40 | (2023.01) | |
| H10K 50/86 | (2023.01) | |

(52) U.S. Cl.
CPC .......... *G06F 3/0412* (2013.01); *G06F 3/0443* (2019.05); *H10K 50/844* (2023.02); *H10K 50/865* (2023.02); *H10K 59/38* (2023.02); *H10K 59/40* (2023.02); *G06F 2203/04111* (2013.01); *G06F 2203/04112* (2013.01); *H10K 59/122* (2023.02)

(58) Field of Classification Search
CPC ... G06F 3/0412; G06F 3/0443; H01L 27/322; H01L 27/323; H01L 51/5253; H01L 51/5284; H01L 27/3246
USPC .......................................................... 257/91
See application file for complete search history.

(56) References Cited

U.S. PATENT DOCUMENTS

| | | | |
|---|---|---|---|
| 2014/0183478 A1* | 7/2014 | Lee .................. | H10K 50/8426 257/40 |
| 2018/0067606 A1* | 3/2018 | Lee ...................... | G06F 3/0446 |

(Continued)

*Primary Examiner* — Kwin Xie
(74) *Attorney, Agent, or Firm* — ArentFox Schiff LLP; Michael Fainberg

(57) ABSTRACT

The present disclosure provides a display panel and a display device. The display panel includes: a driving backplane; a cathode layer located at one side of the driving backplane; and an encapsulating layer located at the side, facing away from the driving backplane, of the cathode layer. The encapsulating layer includes a first inorganic layer, an organic layer and a second inorganic layer which are stacked. The display panel further includes: a first conductive layer located between the first inorganic layer and the organic layer, where the first conductive layer includes first electrode parts; and a second conductive layer located between the first conductive layer and the second inorganic layer and insulated from the first conductive layer.

9 Claims, 6 Drawing Sheets

(56) References Cited

U.S. PATENT DOCUMENTS

| | | | | |
|---|---|---|---|---|
| 2018/0342560 A1* | 11/2018 | Ma | ...................... | H01L 51/5284 |
| 2019/0146622 A1* | 5/2019 | Kang | .................... | G06F 3/0412 |
| | | | | 345/173 |
| 2020/0388653 A1* | 12/2020 | Lee | ......................... | G06F 3/044 |
| 2021/0191552 A1* | 6/2021 | Bok | ...................... | G06F 1/1652 |

* cited by examiner

DISPLAY PANEL AND DISPLAY DEVICE

CROSS REFERENCE TO RELATED APPLICATIONS

This application claims priority to the Chinese Patent Application No. 202010930687.4, filed to the Patent Office of the People's Republic of China on Sep. 7, 2020, the entire contents of which are incorporated herein by reference.

FIELD

The present disclosure relates to the technical field of display, and in particular to a display panel and a display device.

BACKGROUND

In a flat display panel, an organic light emitting display (OLED) panel has attracted extensive attention from people due to the advantages such as self-illumination, quick response, wide viewing angle, high brightness, bright colors, lightweight, small thickness, etc.

SUMMARY

Embodiments of the present disclosure provide a display panel and a display device. The display panel includes: a driving backplane, a cathode layer located at one side of the driving backplane and an encapsulating layer located at one side, facing away from the driving backplane, of the cathode layer;
the encapsulating layer includes a first inorganic layer, an organic layer and a second inorganic layer which are stacked, the first inorganic layer is in contact with the cathode layer, and the second inorganic layer is far away from the cathode layer;
the display panel further includes: a first conductive layer located between the first inorganic layer and the organic layer; where the first conductive layer includes first electrode parts, and the first electrode parts are electrically connected with the cathode layer through via holes penetrating through the first inorganic layer;
the display panel further includes: a second conductive layer located between the first conductive layer and the second inorganic layer and insulated from the first conductive layer; where the second conductive layer includes a plurality of touch electrodes disposed to be insulated; and
the first conductive layer further includes second electrode parts insulated from the first electrode parts, and at least parts of the touch electrodes are electrically connected through the second electrode parts.

In some embodiments, the display panel further includes black matrixes and a color film layer which are located between the first conductive layer and the second inorganic layer, where the black matrixes are provided with a plurality of open areas, and the color film layer is located in the open areas; and
orthographic projections of the first electrode parts, the second electrode parts and the touch electrodes on the driving backplane are within orthographic projections of the black matrixes on the driving backplane.

In some embodiments, the black matrixes and the color film layer are located between the second conductive layer and the second inorganic layer.

In some embodiments, the organic layer includes: a first organic layer located between the first conductive layer and the second conductive layer, and a second organic layer located between the color film layer and the second inorganic layer; and
at least parts of the touch electrodes are electrically connected with the second electrode parts through via holes penetrating through the first organic layer.

In some embodiments, the black matrixes and the color film layer are located between the first conductive layer and the second conductive layer.

In some embodiments, the organic layer includes: a first organic layer located between the first conductive layer and the color film layer, a second organic layer located between the color film layer and the second conductive layer, and a third organic layer located between the second conductive layer and the second inorganic layer, and
at least parts of the touch electrodes are electrically connected with the second electrode parts through via holes sequentially penetrating through the first organic layer, the black matrixes and the second organic layer.

In some embodiments, the cathode layer is provided with hollow areas, and orthographic projections of the hollow areas on the driving backplane cover orthographic projections of the second electrode parts on the driving backplane.

In some embodiments, each of the first electrode parts and the second electrode parts is a grid-like structure, and meshes of the grid-like structure correspond to pixel areas on the display panel.

In some embodiments, the first electrode parts are electrically connected with the cathode layer through via holes penetrating through the first inorganic layer.

In some embodiments, the display panel further includes an anode layer located between the driving backplane and the cathode layer; a pixel defining layer located at one side, facing away from the driving backplane, of the anode layer and provided with a plurality of pixel openings; and a light emitting layer located in the pixel openings.

Accordingly, embodiments of the present disclosure further provide a display device, including the above-mentioned display panels provided by the embodiments of the present disclosure.

DETAILED DESCRIPTION OF THE EMBODIMENTS

In order to make objectives, technical solutions and advantages of the present disclosure clearer, the specific implementations of a display panel and a display device provided in the embodiments of the present disclosure will be described in detail below in conjunction with accompanying drawings.

The thickness and shape of each layer of film in the accompanying drawings are only intended to schematically describe the content of the present disclosure, rather than to reflect a true proportion of the display panel.

Figure 1:
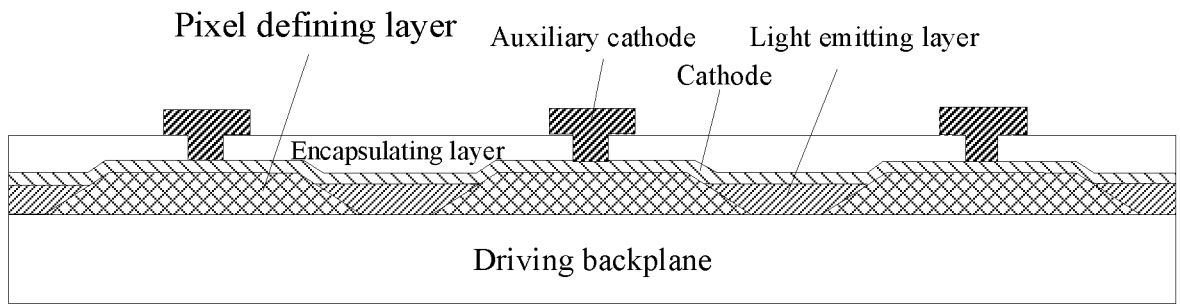
FIG. 1 is a schematic diagram showing a structure of a display panel in the related art.

According to different light emitting surfaces, OLED panels may be divided into top emission display panels and bottom emission display panels. At present, OLED display products occupy an increasing share in large-sized products, so that it will develop more quickly in the future as predicted. When a bottom emission technology is applied to a large-sized OLED display product, display effects of the OLED display products may not be met due to relatively low aperture ratio, and therefore, a top emission technology needs to be developed. For a top emission electroluminescent (EL) device, in order to increase the transparency of a cathodic metal material, the thickness of a film layer has to be reduced and is generally reduced by dozens of nanometers. However, the resistance of a cathode may be greatly increased while a metal layer is thinned. For a large-sized panel, a high-resistance cathode may increase the IR Drop, thereby resulting in non-uniformity of screen display brightness and reducing the display quality. At present, first electrode parts are generally adopted to reduce the resistance of the cathode, thereby reducing the IR Drop. However, the first electrode parts in the prior art are manufactured behind an encapsulating layer, as shown in FIG. 1, which inevitably results in the thickness increment of the display panel.

Figure 2:
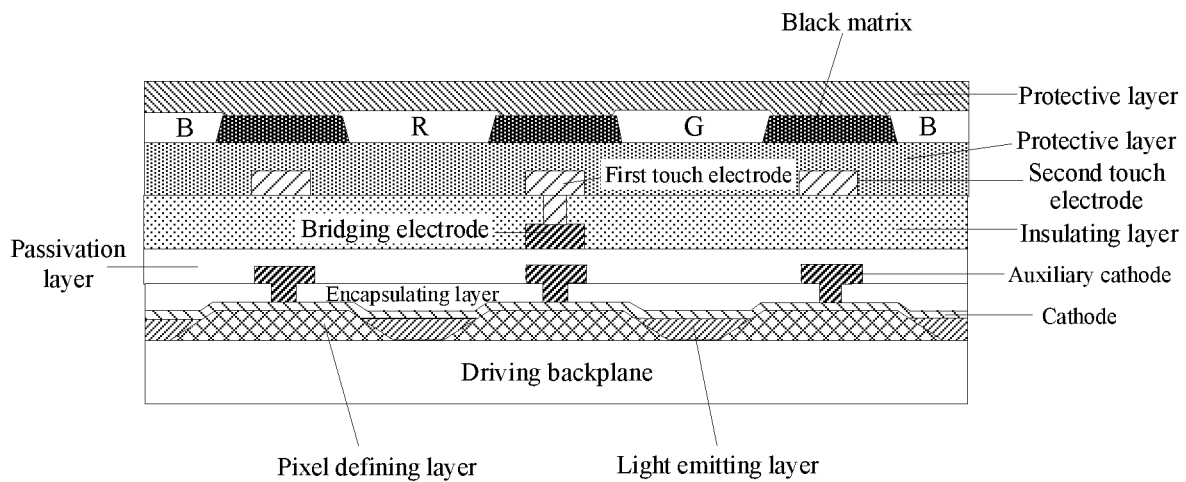
FIG. 2 is a schematic diagram showing a structure of another display panel in the related art.

At present, a capacitor-inductive touch panel is widely applied due to the characteristics such as low cost, capability of realizing real multipoint touch and high reaction speed. A commonly used capacitive touch panel includes second electrode parts, an insulating layer, touch electrodes and a protective layer. The second electrode parts are firstly manufactured, first touch electrodes and second touch electrodes are manufactured in an overlapped way, the first touch electrodes are arranged in an array in a first direction, the second touch electrodes are arranged in an array in a second direction, capacitance is formed between each of the first touch electrodes and each of the second touch electrodes after the touch electrodes are electrified, the capacitance may be changed during touch, a changed signal is collected for calculation, and furthermore, a touch function is achieved. However, the current touch panel is also manufactured behind the encapsulating layer, as shown in FIG. 2; the first electrode parts and the touch electrodes are respectively manufactured by adopting a primary process which is relatively complicated, so that the cost is increased; and a display module is relatively thick.

Figure 3:
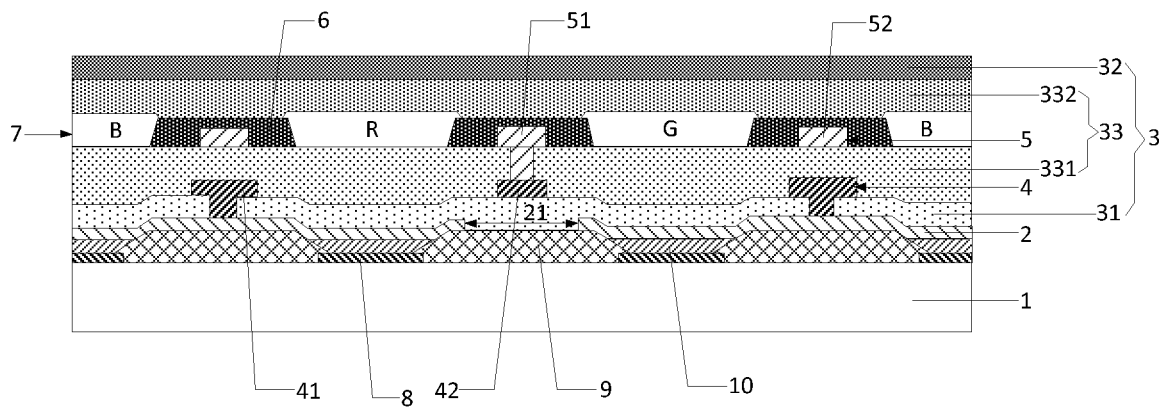
FIG. 3 is a schematic diagram showing a structure of a display panel provided by an embodiment of the present disclosure.
Figure 4:
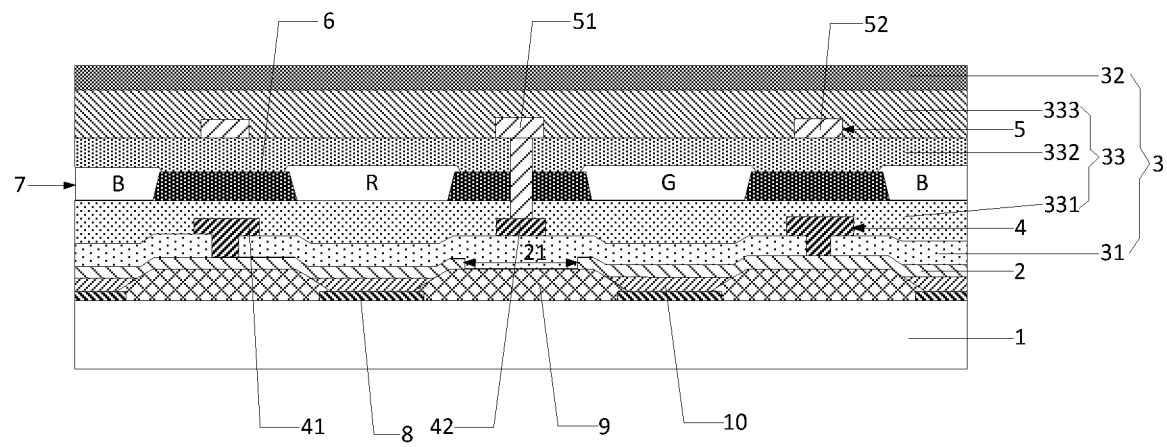
FIG. 4 is a schematic diagram showing a structure of another display panel provided by an embodiment of the present disclosure.

For this purpose, embodiments of the present disclosure provides a display panel, as shown in FIG. 3 and FIG. 4, including a driving backplane 1, a cathode layer 2 located at one side of the driving backplane 1, and an encapsulating layer 3 located at one side, facing away from the driving backplane 1, of the cathode layer 2;

the encapsulating layer 3 includes a first inorganic layer 31, an organic layer 33 and a second inorganic layer 32 which are stacked; the first inorganic layer 31 is in contact with the cathode layer 2; and the second inorganic layer 32 is far away from the cathode layer 2;

the display panel further includes: a first conductive layer 4 located between the first inorganic layer 31 and the organic layer 33; the first conductive layer 4 includes first electrode parts 41; and the first electrode parts 41 are electrically connected with the cathode layer 2 through via holes penetrating through the first inorganic layer 31;

the display panel further includes: a second conductive layer 5 located between the first conductive layer 4 and the second inorganic layer 32 and insulated from the first conductive layer 4; and the second conductive layer 5 includes a plurality of touch electrodes (such as first touch electrodes 51 and second touch electrodes 52) disposed to be insulated; and the first conductive layer 4 further includes second electrode parts 42 insulated from the first electrode parts 41, and at least parts of the touch electrodes (such as the first touch electrodes 51) are electrically connected through the second electrode parts 42.

According to the display panel provided by the embodiments of the present disclosure, the touch electrodes and the first electrode parts are integrated in the encapsulating layer of the display panel, so that the thickness of the display panel may be reduced on the basis that the resistance of the cathode is reduced and the touch electrodes are bridged. In the present disclosure, the second electrode parts are located on the same conductive layer with the first electrode parts, so that one time of Mask may be reduced, and the thickness of the display panel may be further reduced. Therefore, according to the display panel provided by the embodiment of the present disclosure, a Touch technology and a first electrode part technology are integrated in the encapsulating layer, so that the number of film layers, the thickness of the display panel, manufacturing processes and the cost may be reduced.

In some embodiments, each of the first electrode parts may be an auxiliary cathode, and each of the second electrode parts may be a bridging electrode.

In some embodiments, each of the first touch electrodes 51 may be a Tx electrode, and each of the second touch electrodes 52 may be a Rx electrode; or each of the first touch electrodes 51 may be a Rx electrode, and each of the second touch electrodes 52 may be a Tx electrode.

In some embodiments, the above-mentioned display panel provided by the embodiments of the present disclosure, as shown in FIG. 3 and FIG. 4, further includes black matrixes 6 and a color film layer 7 which are located between the first conductive layer 4 and the second inorganic layer 32; the black matrixes 6 are provided with a plurality of open areas; and the color film layer 7 is located in the open areas. Specifically, the color film layer 7 may include a red color film layer R, a green color film layer G and a blue color film layer B. Due to arrangement of the color film layer 7, light generated by the reflection of the display panel may be reduced, and ambient light may be dissipated, so that glare caused by reflection is reduced, the intensity of the outside ambient light received by a viewer is reduced, and the visibility of the display panel is improved.

Orthographic projections of the first electrode parts 41, the second electrode parts 42 and the touch electrodes (such as the first touch electrodes 51 and the second touch electrodes 52) on the driving backplane 1 are within orthographic projections of the black matrixes 6 on the driving backplane 1, and thus, structures of the first conductive layer 4 and the second conductive layer 5 are incapable of affecting the transmittance of the display panel.

In some embodiments, in the above-mentioned display panel provided by the embodiment of the present disclosure, as shown in FIG. 3, the black matrixes 6 and the color film layer 7 are located between the second conductive layer 5 and the second inorganic layer 32, and thus, the black matrixes 6 and the color film layer 7 may be directly manufactured after the second conductive layer 5 is manufactured.

In some embodiments, in the above-mentioned display panel provided by the embodiment of the present disclosure, as shown in FIG. 3, the organic layer 33 includes: a first organic layer 331 located between the first conductive layer 4 and the second conductive layer 5, and a second organic layer 332 located between the color film layer 7 and the second inorganic layer 32.

At least parts of the touch electrodes (such as the first touch electrodes 51) are electrically connected with the second electrode parts 42 through via holes penetrating through the first organic layer 331. According to the display panel shown in FIG. 3, in the present disclosure, the touch electrodes (51 and 52) and the first electrode parts 41 are integrated in the encapsulating layer 3, so that the thickness of the display panel may be reduced. In the present disclosure, the second electrode parts 42 and the first electrode parts 41 are located on the first conductive layer, so that the second electrode parts 42 and the first electrode parts 41 may be formed by adopting one patterning process, therefore reducing one time of Mask, manufacturing processes and the cost.

During specific implementation, in the above-mentioned display panel provided by the embodiment of the present disclosure, as shown in FIG. 4, the black matrixes 6 and the color film layer 7 are located between the first conductive layer 4 and the second conductive layer 5. In this way, the thickness of an insulating layer located between the first conductive layer 4 and the second conductive layer 5 may be increased. The touch electrodes of the second conductive layer 5 are less affected by the first electrode parts 41 of the first conductive layer 4, that is, parasitic capacitance between the first conductive layer 4 and the second conductive layer 5 is reduced, the signal stability of the first conductive layer 4 and the second conductive layer 5 is improved, and furthermore, the performance of the display panel is improved.

During specific implementation, in the above-mentioned display panel provided by the embodiment of the present disclosure, as shown in FIG. 4, the organic layer 33 includes: a first organic layer 331 located between the first conductive layer 4 and the color film layer 7, a second organic layer 332 located between the color film layer 7 and the second conductive layer 5, and a third organic layer 333 located between the second conductive layer 5 and the second inorganic layer 32.

At least parts of the touch electrodes (such as the first touch electrodes 51) are electrically connected with the second electrode parts 42 through via holes sequentially penetrating through the first organic layer 331, the black matrixes 6 and the second organic layer 332. According to the display panel shown in FIG. 4, in the present disclosure, the touch electrodes (51 and 52) and the first electrode parts 41 are integrated in the encapsulating layer 3, so that the thickness of the display panel may be reduced. In addition, in the present disclosure, the second electrode parts 42 and the first electrode parts 41 are located on the first conductive layer, so that the second electrode parts 42 and the first electrode parts 41 may be formed by adopting one patterning process, therefore reducing one time of Mask, manufacturing processes and the cost. Moreover, the color film layer 7 is disposed between the first conductive layer 4 and the second conductive layer 5. In this way, the first organic layer 331, the second organic layer 332 and the color film layer 7 may be jointly used as an insulating layer located between the first conductive layer 4 and the second conductive layer 5, therefore increasing the thickness of the insulating layer located between the first conductive layer 4 and the second conductive layer 5, so that the touch electrodes of the second conductive layer 5 are less affected by the first electrode parts 41 of the first conductive layer 4, that is, parasitic capacitance between the first conductive layer 4 and the second conductive layer 5 is reduced, the signal stability of the first conductive layer 4 and the second conductive layer 5 is improved, and furthermore, the performance of the display panel is improved.

Specifically, as shown in FIG. 3 and FIG. 4, the structure as shown in FIG. 3 has fewer film layers than those in the structure as shown in FIG. 4, which is beneficial to reduce the thickness of a module. However, the touch electrodes in FIG. 3 are closer to the first electrode parts 41, and therefore, a material with a relatively low dielectric constant may be adopted as the first organic layer 331 in the structure as shown in FIG. 3.

During specific implementation, the second electrode parts and the first electrode parts are disposed on the same conductive layer, in this way, the cathode layer is closer to the second electrode parts, and a signal of the cathode layer may generate interference to signals of the touch electrodes. Therefore, in order to prevent the signal of the cathode layer from generating interference to the signals of the touch electrodes, in the above-mentioned display panel provided by the embodiment of the present disclosure, as shown in FIG. 3 and FIG. 4, the cathode layer 2 is provided with hollow areas 21, orthographic projections of the hollow areas 21 on the driving backplane 1 cover orthographic projections of the second electrode parts 42 on the driving backplane 1, and thus, the interference of the cathode layer 2 to the signals of the touch electrodes may be reduced by hollowing the cathode layer 2 located below the second electrode parts 42.

Figure 5:
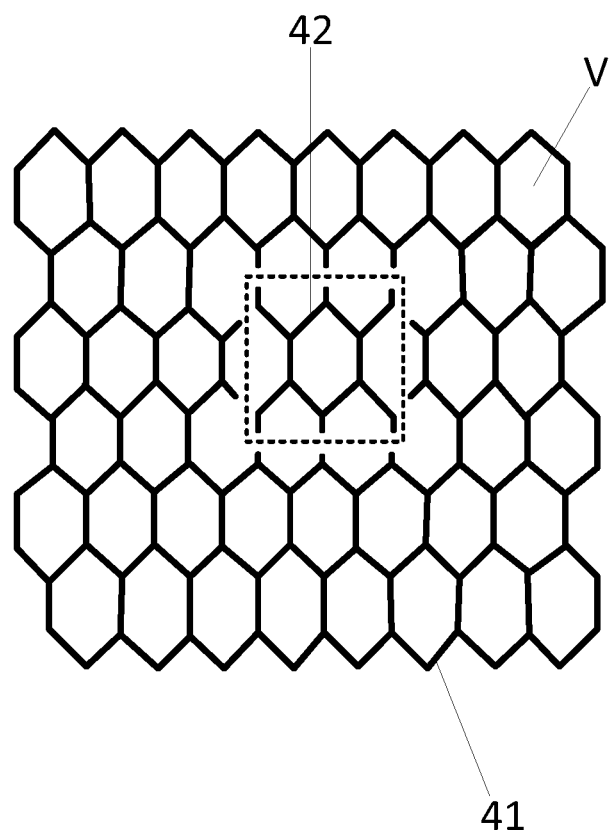
FIG. 5 is a top view showing a structure of a first conductive layer in a display panel provided by an embodiment of the present disclosure.

During specific implementation, in order to increase the transmittance of the display panel, in the above-mentioned display panel provided by the embodiment of the present disclosure, as shown in FIG. 5, each of the first electrode parts 41 and the second electrode parts 42 is a grid-like structure, and meshes V of the grid-like structure correspond to pixel areas on the display panel. Specifically, the display panel generally includes a plurality of pixel areas distributed in an array and non-pixel areas located among the pixel areas. The meshes V of the grid-like structure are in one-to-one correspondence to the pixel areas, that is, the first electrode parts 41 and the second electrode parts 42 are wired around each of the pixel areas, and the first electrode parts 41 and the second electrode parts 42 may be divided into two areas which are disconnected. For example, a first area is located outside a dotted box, a second area is located inside the dotted box, the first area is used as the first electrode parts 41 to be electrically connected with the cathode layer, and the second area is used as the second electrode parts 42 to be electrically connected with the touch electrodes.

During specific implementation, in the above-mentioned display panel provided by the embodiment of the present disclosure, as shown in FIG. 3 and FIG. 4, the first electrode parts 41 are electrically connected with the cathode layer 2 through via holes penetrating through the first inorganic layer 31.

During specific implementation, the above-mentioned display panel provided by the embodiment of the present disclosure, as shown in FIG. 3 and FIG. 4, further includes: an anode layer 8 located between the driving backplane 1 and the cathode layer 2; a pixel defining layer 9 located at one side, facing away from the driving backplane 1, of the anode layer 8 and provided with a plurality of pixel openings; and a light emitting layer 10 located in the pixel openings.

Specifically, the driving backplane includes: a base substrate, and a thin film transistor structure located on the base substrate and disposed in an array. A thin film transistor is electrically connected with the anode layer, the thin film transistor inputs an anode voltage to the anode layer and inputs a cathode voltage to the cathode layer. That is, an electron injected into the cathode layer and a hole injected into the anode layer are combined in the light emitting layer under the drive of an external voltage to form an electron hole pair in a bound level, that is, an exciton, and the exciton radiates and de-excites to emit a photon, thereby generating visible light.

During specific implementation, the above-mentioned display panel provided by the embodiment of the present disclosure further includes other functional film layers well known by those skilled in the art, and the descriptions thereof are omitted herein.

It should be noted that the above-mentioned display panel provided by the embodiment of the present disclosure is mainly applied to a large-sized top emission OLED device.

Manufacturing steps of the display panel shown in FIG. 3 and FIG. 4 in the embodiment of the present disclosure will be described in detail below in conjunction with specific embodiments.

The manufacturing steps of the display panel shown in FIG. 3 are described as follows.

Figure 6A:
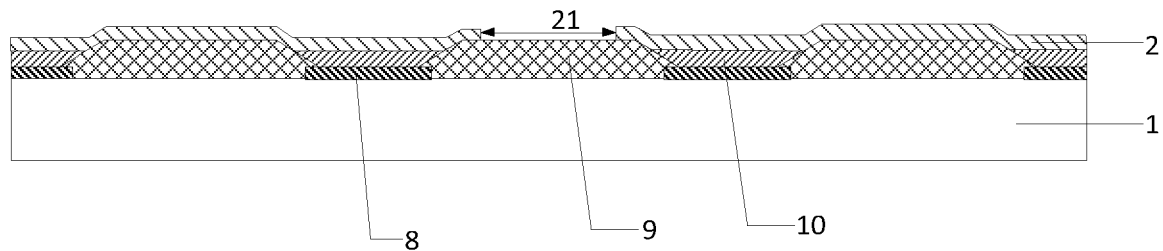
FIG. 6A is a first flow diagram showing a manufacturing method of the display panel shown in FIG. 3 in the embodiment of the present disclosure.

(1) A driving backplane 1 with a thin film transistor array is manufactured, an anode layer 8 is manufactured on the driving backplane 1, a pixel defining layer 9 with pixel openings is manufactured on the anode layer 8, a light emitting layer 10 is manufactured in the pixel openings, and a cathode layer 2 is manufactured at one side, facing away from the driving backplane 1, of the light emitting layer 10; where the cathode layer 2 is provided with hollow areas 21 on positions where second electrode parts 42 are subsequently formed, that is, cathode material evaporation may not be performed in the hollow areas 21, and the hollow areas 21 are located in non-pixel areas among pixel areas, so that the electric connection of the overall cathode layer 2 is not affected, as shown in FIG. 6A.

Figure 6B:
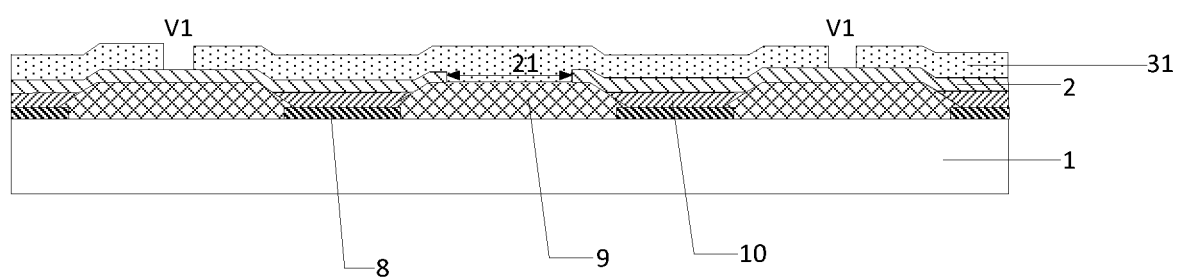
FIG. 6B is a second flow diagram showing a manufacturing method of the display panel shown in FIG. 3 in the embodiment of the present disclosure.

(2) A first inorganic layer 31 is deposited at one side, facing away from the driving backplane 1, of the cathode layer 2; and a position corresponding to the pixel defining layer 9 is drilled by using an etching process to form via holes V1, as shown in FIG. 6B.

Figure 6C:
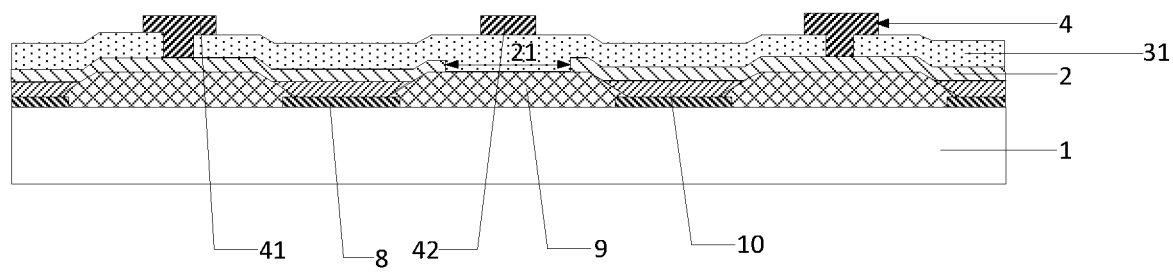
FIG. 6C is a third flow diagram showing a manufacturing method of the display panel shown in FIG. 3 in the embodiment of the present disclosure.

(3) A conductive material is deposited at one side, facing away from the driving backplane 1, of the first inorganic layer 31; and a pattern of a first conductive layer 4 is formed by exposure, development and etching processes; where the pattern of the first conductive layer 4 includes first electrode parts 41 and second electrode parts 42, the first electrode parts 41 are electrically connected with the cathode layer 2 through the via holes V1, and the second electrode parts 42 correspond to the hollow areas of the cathode layer 2, as shown in FIG. 6C.

Figure 6D:
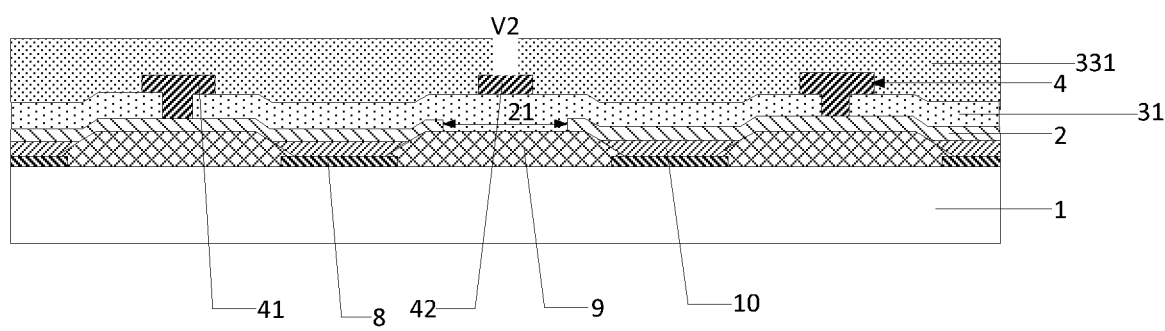
FIG. 6D is a fourth flow diagram showing a manufacturing method of the display panel shown in FIG. 3 in the embodiment of the present disclosure.

(4) A first organic layer 331 is formed at one side, facing away from the driving backplane 1, of the first conductive layer 4; and via holes V2 are formed in positions corresponding to the second electrode parts 42; where the first organic layer 331 is used as an insulating layer of touch electrodes which are subsequently formed, as shown in FIG. 6D.

Figure 6E:
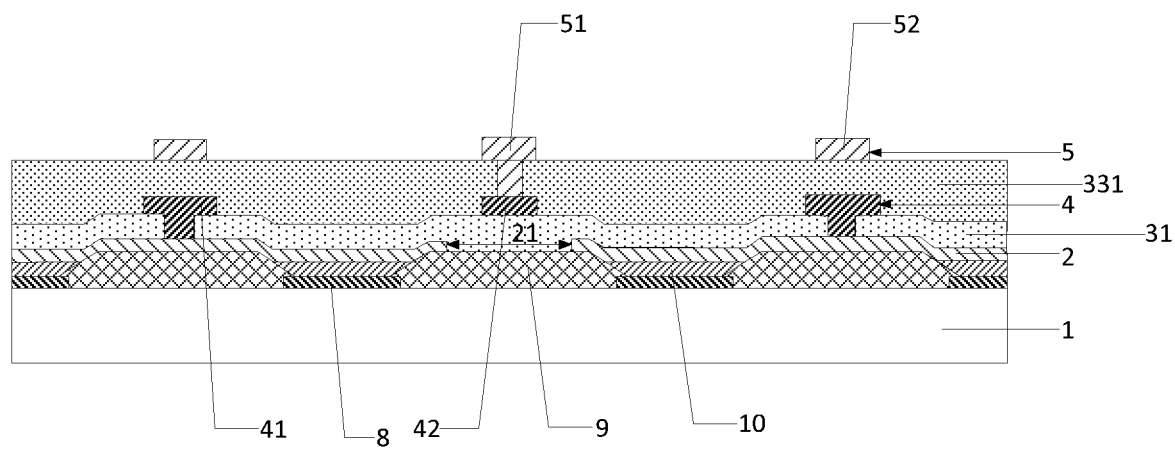
FIG. 6E is a fifth flow diagram showing a manufacturing method of the display panel shown in FIG. 3 in the embodiment of the present disclosure.

(5) A conductive material is deposited at one side, facing away from the driving backplane 1, of the first organic layer 331; and a pattern of a second conductive layer 5 is formed by exposure, development and etching processes; where the pattern of the second conductive layer 5 includes first touch electrodes 51 and second touch electrodes 52, and the first touch electrodes 51 are electrically connected with the second electrode parts 42 through via holes V2, as shown in FIG. 6E.

Figure 6F:
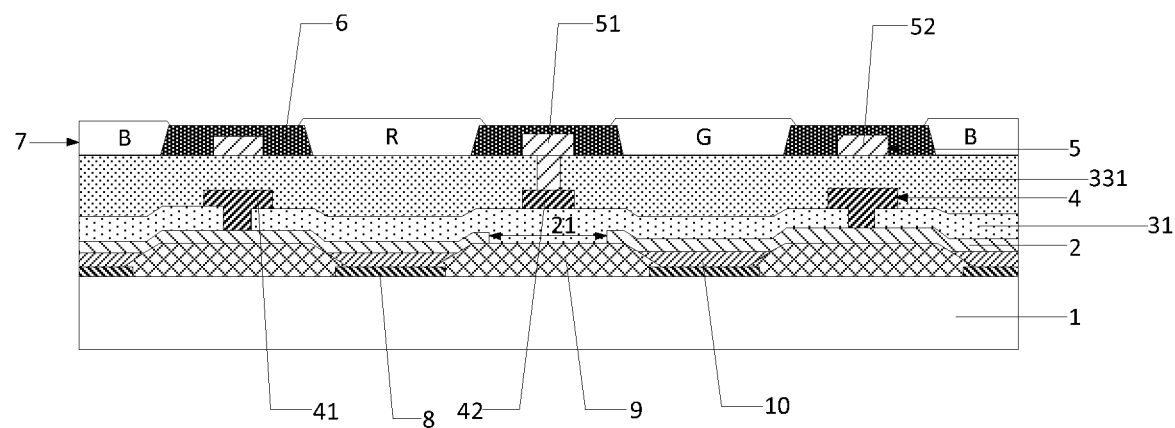
FIG. 6F is a sixth flow diagram showing a manufacturing method of the display panel shown in FIG. 3 in the embodiment of the present disclosure.

(6) Black matrixes 6 and a color film layer 7 are formed at one side, facing away from the driving backplane 1, of the second conductive layer 5 by a photoetching process, as shown in FIG. 6F.

Figure 6G:
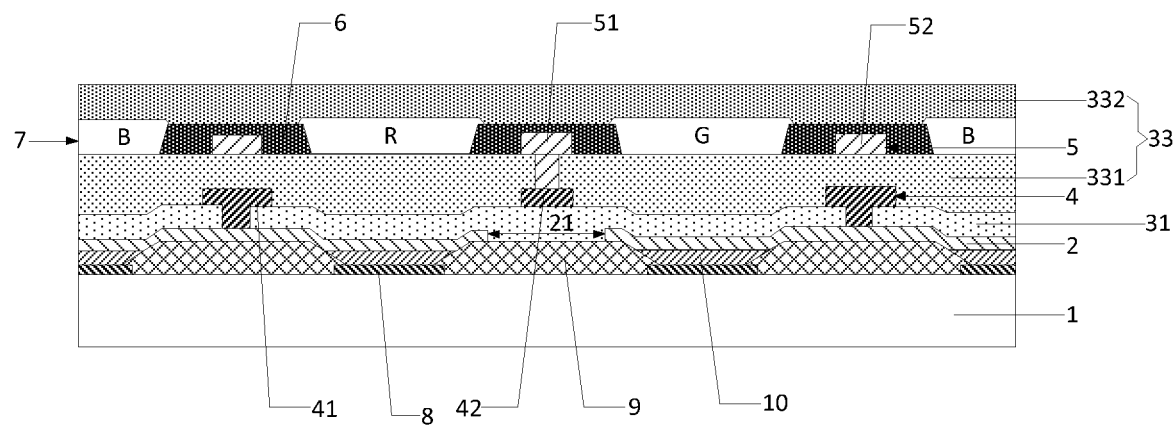
FIG. 6G is a seventh flow diagram showing a manufacturing method of the display panel shown in FIG. 3 in the embodiment of the present disclosure.

(7) A second organic layer 332 is formed at one side, facing away from the driving backplane 1, of the color film layer 7; where the second organic layer 332 may be used as a protective layer, as shown in FIG. 6G.

(8) A second inorganic layer 32 is formed at one side, facing away from the driving backplane 1, of the second organic layer 332; where the first inorganic layer 31, the first organic layer 331, the second organic layer 332 and the second inorganic layer 32 form an encapsulating layer 3 of the display panel, as shown in FIG. 3.

The manufacturing steps of the display panel shown in FIG. 4 are described as follows.

The steps of manufacturing the first organic layer 331 and film layers in front of the first organic layer 331 are same as above-mentioned steps (1) to (4) in FIG. 3, the descriptions thereof are omitted herein. Steps of manufacturing the first organic layer 331 and the film layers in front of the first organic layer 331 in FIG. 4 refer to the above-mentioned steps (1) to (4) in FIG. 3.

Figure 7A:
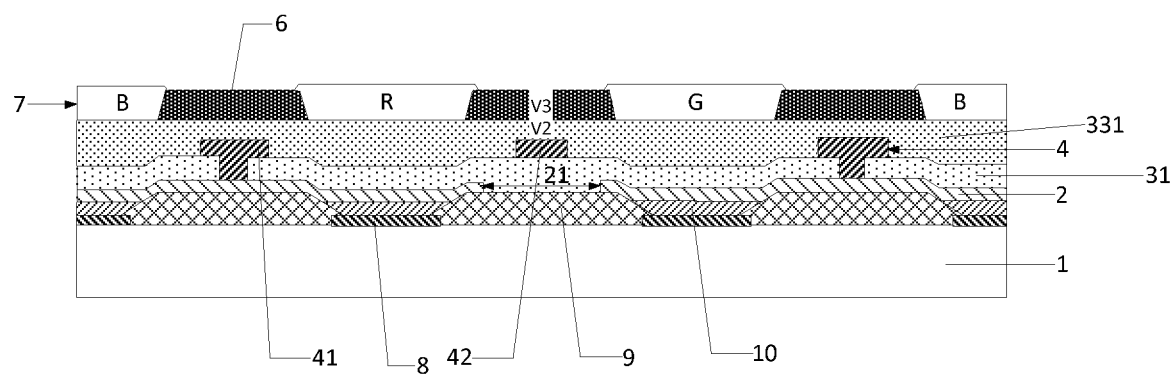
FIG. 7A is a first flow diagram showing a manufacturing method of the display panel shown in FIG. 4 in the embodiment of the present disclosure.

(5) Black matrixes 6 and a color film layer 7 are formed at one side, facing away from the driving backplane 1, of the first organic layer 331 by a photoetching process; and via holes V3 are formed in positions, corresponding to the second electrode 42, on the black matrixes 6, as shown in FIG. 7A.

Figure 7B:
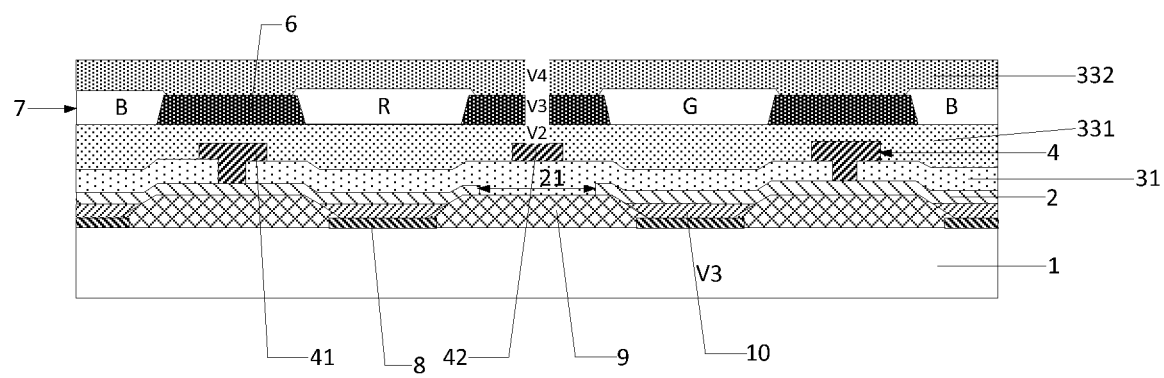
FIG. 7B is a second flow diagram showing a manufacturing method of the display panel shown in FIG. 4 in the embodiment of the present disclosure.

(6) A second organic layer 332 is formed at one side, facing away from the driving backplane 1, of the color film layer 7; and via holes V4 are formed in positions corresponding to the second electrode parts 42, as shown in FIG. 7B.

Figure 7C:
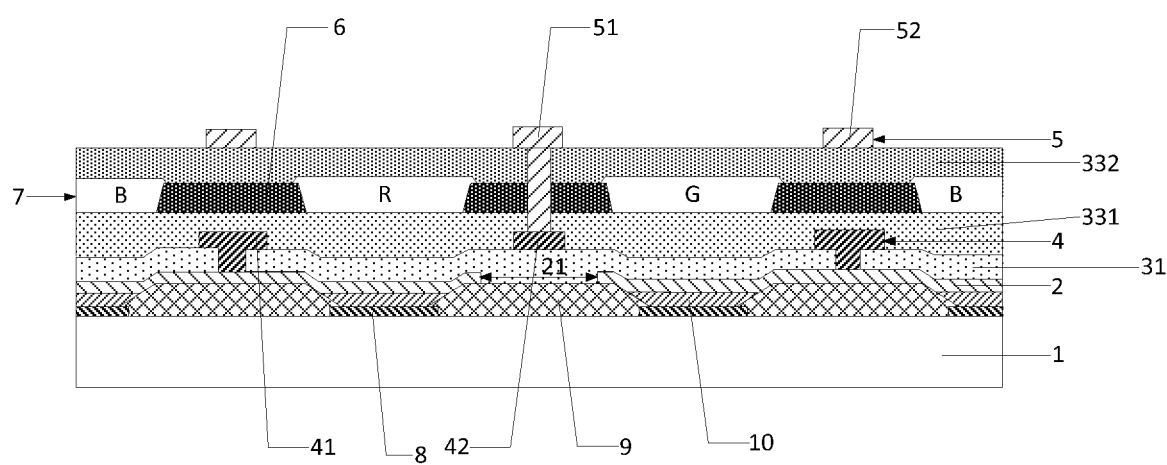
FIG. 7C is a third flow diagram showing a manufacturing method of the display panel shown in FIG. 4 in the embodiment of the present disclosure.

(7) A conductive material is deposited at one side, facing away from the driving backplane 1, of the second organic layer 332; and a pattern of a second conductive layer 5 is formed by exposure, development and etching; where the pattern of the second conductive layer 5 includes first touch electrodes 51 and second touch electrodes 52; and the first touch electrodes 51 are electrically connected with the second electrode parts 42 through via holes V4, via holes V3 and via holes V2, as shown in FIG. 7C.

Figure 7D:
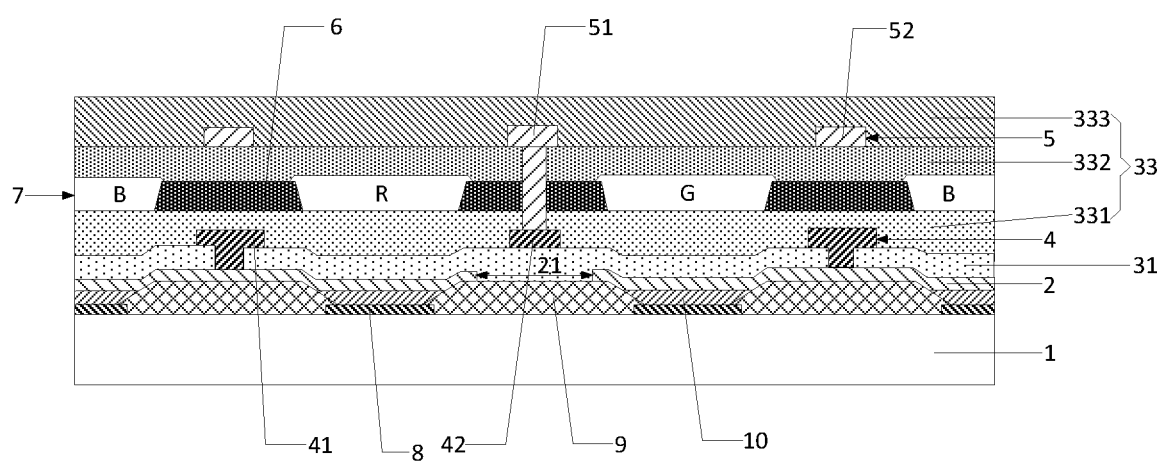
FIG. 7D is a fourth flow diagram showing a manufacturing method of the display panel shown in FIG. 4 in the embodiment of the present disclosure.

(8) A third organic layer 333 is formed at one side, facing away from the driving backplane 1, of the second conductive layer 5; where the third organic layer 333 is used as a protective layer, as shown in FIG. 7D.

(9) A second inorganic layer 32 is formed at one side, facing away from the driving backplane 1, of the third organic layer 333; where the first inorganic layer 31, the first organic layer 331, the second organic layer 332, the third organic layer 333 and the second inorganic layer 32 form an encapsulating layer 3 of the display panel, as shown in FIG. 4.

It should be noted that, in the manufacturing method of the above-mentioned array substrate provided by the embodiment of the present disclosure, the patterning process may only include a photoetching process, or include the photoetching process and etching steps and may also include other processes such as printing and ink jet for forming a preset pattern; and the photoetching process refers to a process which includes processes such as film formation, exposure and development and is used for forming a pattern by using a photoresist, a mask plate, an exposure machine and the like. During specific implementation, the corresponding patterning process may be selected according to a structure formed in the present disclosure.

Based on the same inventive concept, embodiments of the present disclosure further provide a display device, including the above-mentioned display panel provided by the embodiment of the present disclosure. The display device may be any product or component with a display function, such as a mobile phone, a tablet personal computer, a television, a display, a notebook computer, a digital photo frame and a navigator. Other essential components of the display device should be understood to be provided by the ordinary skilled in the art, the descriptions thereof are omitted herein, and the components should not be regarded as limitations to the present disclosure. The problem solving principle of the display device is similar to that of the above-mentioned display panel, and therefore, the implementation of the display device may refer to the embodiment of the above-mentioned display panel, the descriptions thereof are omitted herein.

According to the display panel and the display device provided by the embodiments of the present disclosure, the touch electrodes and the first electrode parts are integrated in the encapsulating layer of the display panel, so that the thickness of the display panel may be reduced on the basis that the resistance of the cathode is reduced and the touch electrodes are bridged. In the present disclosure, the second electrode parts are located on the same conductive layer with the first electrode parts, so that one time of Mask may be reduced, and the thickness of the display panel may be further reduced. Therefore, according to the display panel provided by the embodiments of the present disclosure, a Touch technology and a first electrode part technology are integrated in the encapsulating layer, so that the number of film layers, the thickness of the display panel, manufacturing processes and the cost may be reduced.

Obviously, those skilled in the art can make various alterations and transformations on the present disclosure without departing from the spirit and scope of the present disclosure. In this way, if these alterations and transformations of the present disclosure fall within the scope of the claims of the present disclosure and equivalent technologies of the claims, the present disclosure is also intended to include these alterations and transformations.

What is claimed is:

1. A display panel, comprising:
a driving backplane;
a cathode layer arranged at one side of the driving backplane; and
an encapsulating layer arranged at one side, facing away from the driving backplane, of the cathode layer;
wherein the encapsulating layer comprises: a first inorganic layer, an organic layer and a second inorganic layer which are stacked; the first inorganic layer is in direct contact with the cathode layer; and the second inorganic layer is away from the cathode layer;
wherein the display panel further comprises:
a first conductive layer arranged between the first inorganic layer and the organic layer, wherein the first conductive layer comprises first electrode parts and second electrode parts insulated from the first electrode parts, and the first electrode parts are arranged to enclose the second electrode parts; and
a second conductive layer arranged between the first conductive layer and the second inorganic layer and insulated from the first conductive layer;
wherein the second conductive layer comprises a plurality of touch electrodes disposed to be insulated, and
at least parts of the touch electrodes are electrically connected with the second electrode parts;
wherein the first electrode parts are electrically connected with the cathode layer through via holes penetrating through the first inorganic layer; and
wherein the cathode layer is provided with hollow areas, and orthographic projections of the hollow areas on the driving backplane completely cover orthographic projections of the second electrode parts on the driving backplane, and not cover orthographic projections of the first electrode parts on the driving backplane.

2. The display panel according to claim 1, further comprising black matrixes and a color film layer which are arranged between the first conductive layer and the second inorganic layer;
wherein the black matrixes are provided with a plurality of open areas;
the color film layer are arranged in the open areas; and
orthographic projections of the first electrode parts, the second electrode parts and the touch electrodes on the driving backplane are within orthographic projections of the black matrixes on the driving backplane.

3. The display panel according to claim 2, wherein the black matrixes and the color film layer are arranged between the second conductive layer and the second inorganic layer.

4. The display panel according to claim 3, wherein the organic layer comprises:
  a first organic layer arranged between the first conductive layer and the second conductive layer, and
  a second organic layer arranged between the color film layer and the second inorganic layer;
  wherein at least parts of the touch electrodes are electrically connected with the second electrode parts through via holes penetrating through the first organic layer.

5. The display panel according to claim 2, wherein the black matrixes and the color film layer are arranged between the first conductive layer and the second conductive layer.

6. The display panel according to claim 5, wherein the organic layer comprises:
  a first organic layer arranged between the first conductive layer and the color film layer,
  a second organic layer arranged between the color film layer and the second conductive layer, and
  a third organic layer arranged between the second conductive layer and the second inorganic layer;
  wherein at least parts of the touch electrodes are electrically connected with the second electrode parts through via holes sequentially penetrating through the first organic layer, the black matrixes and the second organic layer.

7. The display panel according to claim 1, wherein each of the first electrode parts and the second electrode parts is a grid-like structure, and
  meshes of the grid-like structure correspond to pixel areas on the display panel.

8. The display panel according to claim 1, further comprising:
  an anode layer arranged between the driving backplane and the cathode layer;
  a pixel defining layer arranged at one side, facing away from the driving backplane, of the anode layer and provided with a plurality of pixel openings; and
  a light emitting layer arranged in the pixel openings.

9. A display device, comprising the display panel according to claim 1.

* * * * *